United States Patent [19]
Porter

[11] Patent Number: 4,950,181
[45] Date of Patent: Aug. 21, 1990

[54] REFRIGERATED PLUG-IN MODULE

[75] Inventor: Warren W. Porter, Escondido, Calif.

[73] Assignee: NCR Corporation, Dayton, Ohio

[21] Appl. No.: 225,126

[22] Filed: Jul. 28, 1988

[51] Int. Cl.$^5$ .............................................. H05K 7/20
[52] U.S. Cl. ................................... 439/485; 361/382; 361/385
[58] Field of Search .................. 439/196, 485, 487; 361/382–388, 400, 405; 174/15.4, 16.3; 165/185, 80.3, 80.4; 357/81, 82

[56] References Cited

U.S. PATENT DOCUMENTS

| | | | |
|---|---|---|---|
| 3,289,046 | 11/1966 | Carr | 317/101 |
| 3,412,566 | 11/1968 | Townsend et al. | 62/3 |
| 3,585,355 | 6/1971 | Nasser | 219/209 |
| 3,740,839 | 6/1973 | Otte et al. | 29/628 |
| 4,118,947 | 10/1978 | Diedrich et al. | 62/514 R |
| 4,138,183 | 2/1979 | Soos | 339/94 M |
| 4,233,645 | 11/1980 | Balderes et al. | 361/385 |
| 4,279,292 | 7/1981 | Swiatosz | 357/82 |
| 4,341,432 | 7/1982 | Cutchaw | 439/485 |
| 4,402,185 | 9/1983 | Perchak | 62/3 |
| 4,464,005 | 8/1984 | Dwight | 339/112 R |
| 4,587,594 | 5/1986 | McPherson | 361/383 |
| 4,734,820 | 3/1988 | Lauffer et al. | 361/385 |
| 4,800,422 | 1/1989 | Sanwo et al. | 357/82 |
| 4,805,420 | 2/1989 | Porter et al. | 361/385 |

FOREIGN PATENT DOCUMENTS 190372  11/1982  Japan .

Primary Examiner—Neil Abrams
Attorney, Agent, or Firm—Wilbert Hawk, Jr.; Stephen F. Jewett; Jack R. Penrod

[57] ABSTRACT

A module for insulatively housing and refrigerating a semiconductor device which is designed to be plugged into a printed circuit board within a conventional air-cooled electronic system. The plug-in module is designed such that the semiconductor device within the module can be operated at temperatures from −200° C. down to the temperatures of liquid helium, while a short distance below the housing portion of the module the plug-in conductors connect to a connector on a conventionally cooled processor board. This is accomplished without frost or other type of troublesome moisture forming on the plug-in conductors.

7 Claims, 3 Drawing Sheets

REFRIGERATED PLUG-IN MODULE

BACKGROUND OF THE INVENTION

The present invention relates to the field of plug-in modules and more particularly to plug-in modules for connecting a refrigerated semiconductor device to an air-cooled printed circuit board.

The benefits of operating certain types of integrated circuits from cooler temperatures down to cryogenic temperatures is well known. For some types of integrated circuits the resistance decreases and the switching speed increases as the operating temperature decreases towards absolute zero. For example, when a cryogenic temperature of liquid nitrogen, i.e. $-196°$ C., is applied to a VLSI CMOS integrated circuit the switching speed increases as described in allowed U.S. Pat. No. 4,800,622 issued Jan. 24, 1989. J. Sanwo entitled "A FROSTLESS INTERFACE SUPERCOOLED VLSI SYSTEM", which is hereby incorporated by reference.

One problem associated with refrigerating a VLSI circuit is the moisture which condenses on the leads running between the refrigerated VLSI circuit and the room temperature electronic equipment it connects with. If frost gathers, the frost will thicken until its outer surface loses the capacity to freeze additional airborne moisture. If, however, the surface temperature of the frost is colder than the dew point of the surrounding room-temperature environment (which it nearly always is), moisture will continue to collect as dripping water. Such a frost build-up can impose undesirable physical stresses on components, and can cause signal leakage/crosstalk between electrical leads. Water pools can cause corrosion and electrical short circuits. Such conditions are not acceptable in a high speed electronic system.

It is an object of this invention to provide a system for connecting a refrigerated VLSI circuit to a room temperature system which does not collect frost or moisture.

It is a further object of this invention to provide such a connecting system that has an integral heater approximately located to the egress of the electrical leads from the connecting system.

It is a further object of this invention to provide such a connecting system having a device for controlling the temperature of the electrical leads.

SUMMARY

Briefly stated, in accordance with one aspect of the invention, the foregoing objects are achieved by providing a system for refrigerating a semiconductor circuit including an insulated housing having a mounting device for the semiconductor circuit within the insulated housing. An electricity conducting device electrically couples signals from the semiconductor circuit to a connector located outside of the housing. This electricity conducting device has a low thermal conductance. The system has a device for refrigerating the semiconductor circuit mounted inside the insulated housing.

In another aspect of the invention, the above objects are achieved by providing a system for refrigerating a semiconductor circuit including an insulated housing having a mounting device for the semiconductor circuit within the insulated housing. A low thermal conductance, electricity conducting device electrically couples signals from the semiconductor circuit to a connector located outside of the housing. The system has a device for refrigerating the semiconductor circuit mounted inside the insulated housing thermally connected thereto. Moreover, the electrically conducting device has a heating device associated therewith to increase the temperature of the low thermal conductance electrically conducting device within the insulated housing.

BRIEF DESCRIPTION OF THE DRAWINGS

While the specification concludes with claims particularly pointing out and distinctly claiming the subject matter which is regarded as the invention, it is believed that the invention will be better understood from the following description of the preferred embodiments taken in conjunction with the accompanying drawings in which:

DETAILED DESCRIPTION OF A PREFERRED EMBODIMENT

Figure 1:
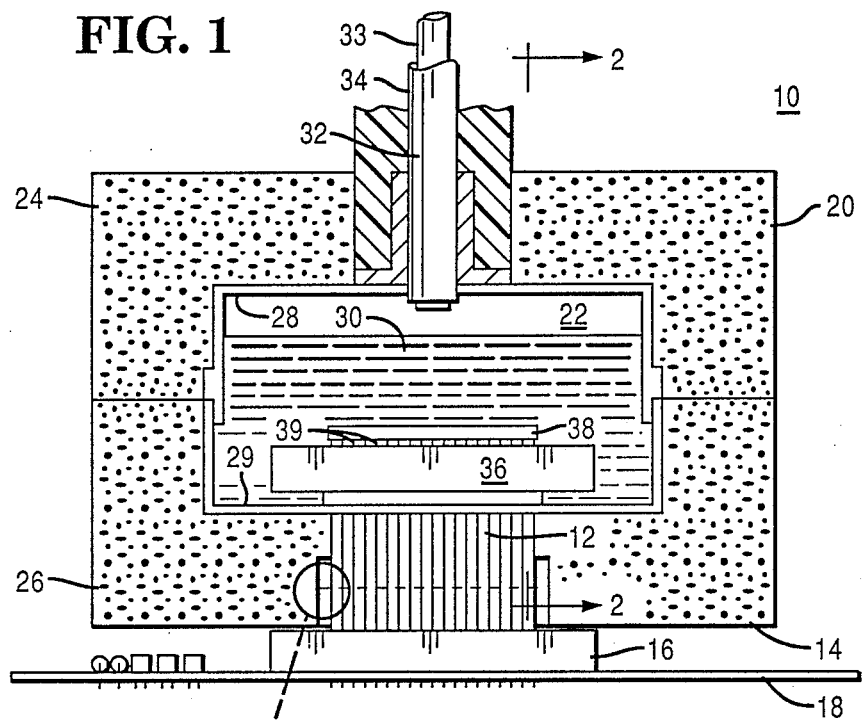
FIG. 1 is a cross sectional view of a plug-in module in accordance with the present invention.

Referring to FIG. 1, there is shown a simplified cross sectional view of a refrigerated plug-in module 10 constructed in accordance with the invention. The plug-in module 10 has a number of electrical conductors 12 along its lower side 14. The electrical conductors 12 are arranged to connect with an external connector 16 which is mounted on printed circuit board 18.

The plug-in module 10 has an insulative housing 20 surrounding a chamber 22. The housing 20 has an upper insulator portion 24 and a lower insulator portion 26. Both the upper insulator portion 24 and the lower insulator portion 26 are made from a low thermal conductance material such as a polystyrene plastic foam. In the preferred embodiment, each insulator portion 24, 26 has a respective liner 28, 29. The two liners 28, 29 are typically made of a thermoplastic fluro-carbon polymer such as sold by E. I. Du Pont de Nemours and Co. under the trademark Teflon. The upper liner 28 fits tightly with the lower liner 29 to form a leak-proof seal therebetween such that the chamber 22 can be filled with a refrigerant 30 such as liquid nitrogen or liquid helium without losing any by leakage.

Connected to the top of the housing 10 is a cryogenic fluid transfer conduit 32 which performs the dual purpose of supplying the refrigerant through one tube 33 and exhausting the boiled off refrigerant through a second tube 34. Such a conduit is described in U.S. Pat. No. 4,745,760 which was granted to the inventor of the present invention on May 24, 1988 and is assigned to the assignee as the present invention, NCR Corporation. Thus, this known conduit will not be further described here.

An integrated circuit connector 36 is attached to the lower liner 29 within the chamber 22. An integrated circuit 38 is mounted with its leads 39 inserted into the connector 36.

Figure 2:
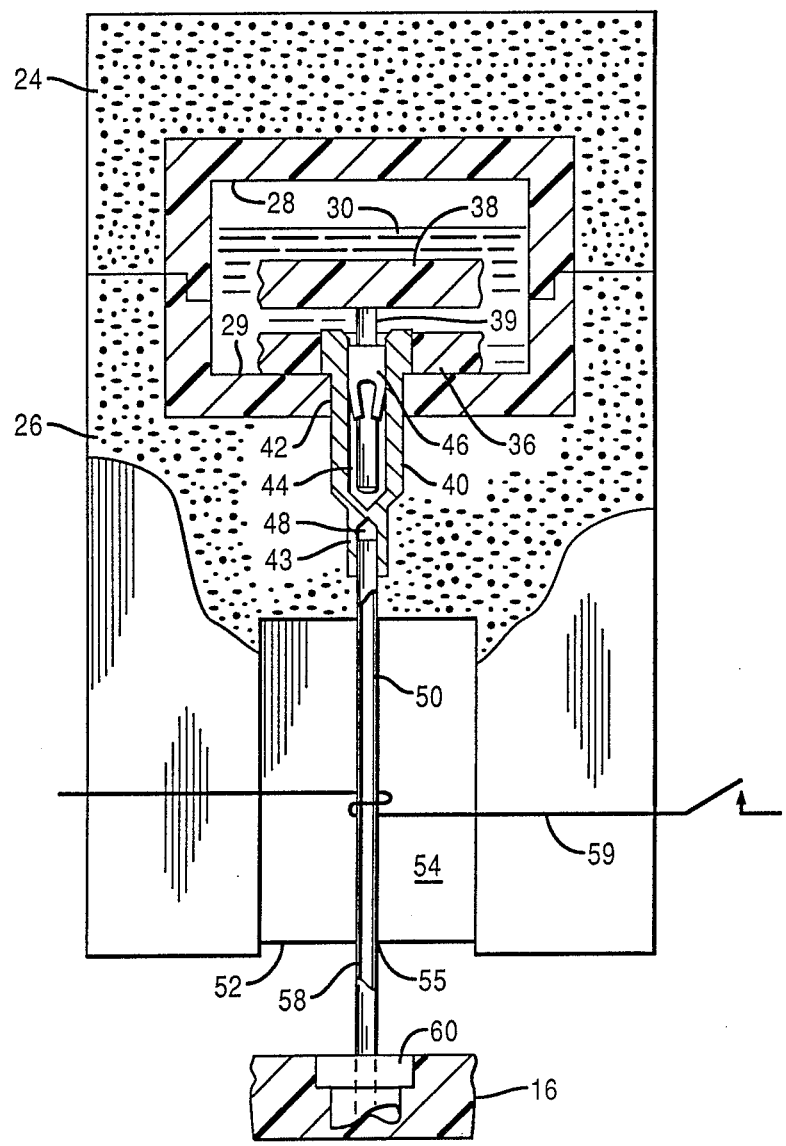
FIG. 2 is a partial sectional view 1 taken along line 2—2 of FIG. 1 showing a low thermal conductance electrical conductor.

Referring now to FIG. 2 in conjunction with FIG. 1, the connector 36 has a number of receptacles 40 in which the integrated circuit leads 39 are inserted. The receptacles 40 are located in holes 42 through the lower liner 29. Those skilled in the art will appreciate that the connector 36 and the receptacles 40 must form a leak-proof seal with the lower liner 29 and/or the holes 42. This is accomplished by a press fit between the hole 42 and the receptacle. The tightness of this press fit is enhanced by the introduction of the refrigerant 30, which causes the material of the lower liner 29, as well as the holes 42 therethrough, to shrink around each receptacle 40. Below the liner 29, each receptacle 40 is located within a respective passage 43 through the lower insulative portion 26.

Each receptacle 40 has a hollow space 44 into which one of the leads 39 is inserted. Attached to the receptacle 40 inside the hollow space 44 is a spring clip 46. Each spring clip 46 provides two important functions. First, each spring clip 46 makes an electrical connection between the integrated circuit lead 39 and the receptacle 40. Second, each spring clip 46 holds the lead 39 within the hollow space 44 such that very little physical contact between the lead 39 and the receptacle 40 occurs. This latter function reduces the thermal conductance between each lead 39 and its respective receptacle 40 to a minimum for this configuration.

At the bottom of each receptacle 40 is a second hollow space 48 into which is inserted a low thermal conductance electrical conductor 50. Each conductor 50 is made from a thin walled tubular metal, such as stainless steel, which has a substantially lower thermal conductance than a normal, copper alloy solid conductor. To ensure a good electrical contact, however, each conductor 50 is plated with a thin coating of good electrical conductivity material, such as gold. In the embodiment shown in FIG. 2, each conductor 50 is attached to its respective receptacle 40 by crimping, welding, or other similar process. Since heat will be transferred from the outside surface of the conductor 50 to the adjacent, inside surface of its overlapping receptacle 40, the amount of overlap should be kept as low as practical.

Figure 3:
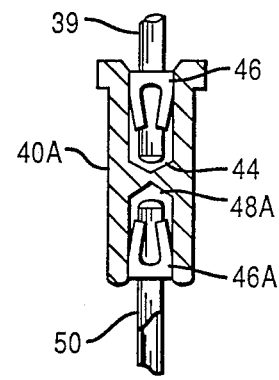
FIG. 3 is a detailed view of an alternate connection mechanism between the VLSI circuit lead and the low thermal conductance electrical conductor.

FIG. 3 shows, in a partial cross sectional view, a second embodiment of the invention using a modified receptacle 40A. Receptacle 40A has a hollow space 44 in the upper portion thereof and a second hollow space 48A in the lower portion thereof. The spring clip 46 is attached to the receptacle 40A within the hollow space 44 and a lower spring clip 46A is similarly attached within the second hollow space 48A. In this embodiment, each integrated circuit lead 39 is connected to its respective receptacle 40A by the spring clip 46 as in the embodiment shown in FIG. 2. In contrast to the embodiment of FIG. 2, each low thermal conductance electrical conductor 50 is similarly connected to its respective receptacle 40A by the lower spring clip 46A instead of crimping, welding or other similar process.

Referring again to FIG. 2, each conductor 50 extends from its respective receptacle 40 through passage 43 into a channel 52. The channel 52 may be shaped in any of a number of known ways either by including the channel 52 in the initial forming of the lower insulator portion 26, or by cutting out the channel 52 afterwards. The channel 52 is partially filled with an electrically insulating, thermal conducting material 54, such as a silicone rubber compound. The thermal conducting material 54 forms a seal 55 with each of the conductors 50. In operation, the thermal conducting material 54 conducts heat from the room temperature environment and provides a path for it to flow into each conductor 50. That path is essentially the length of the channel 52 up to the seal 55. This heating action and the seal 55 allow the lower portion 58 of the conductor 50 to be frost and moisture free because the temperature of each conductor 50 transitions along its length from essentially the refrigerant temperature, where it connects with the receptacle 40, to above the dew point temperature, before the conductor 50 emerges from its respective seal 55 to the external environment. Thus, each lower portion 58 of the conductor 50 is substantially at room temperature when it is plugged into its respective receptacle 60 of the external connector 16. As will be more fully discussed later in conjunction with FIG. 5, a heater 59 assists in maintaining the lower portion 58 of conductor 50 at room temperature. The heater 59 is located near each of the conductors 50 and is secured in position by the thermal conducting material 54. The thermal conducting material 54 holds and directs heat from heater 59 to the conductors 50 in substantially the same way that it conducts heat from the external environment thereto.

Figure 4:
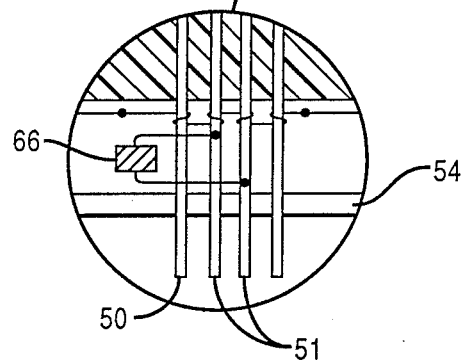
FIG. 4 is a detailed partial sectional view of FIG. 1 showing a heater conductor and a temperature sensor in the plug-in module of FIG. 1.

Referring now to FIG. 4, there is shown a temperature sensor 66 which is attached to two conductors 51 and is suspended in the thermal conducting material 54. The two conductors 51 that the sensor 66 is attached to connect to leads 39 (see FIG. 2) of the integrated circuit 38 (see FIG. 2), which are inactive. Thermally, the conductors 51 respond substantially the same as the conductors 50. The conductors 51 operate in conjunction with sensor 66 to provide a sensor signal to a heater control circuit 70 shown in FIG. 5.

Figure 5:
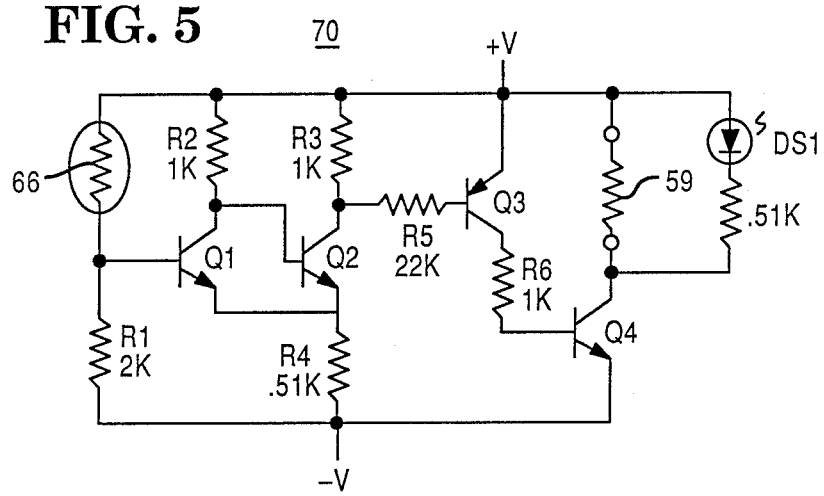
FIG. 5 is a schematic diagram of an electronic circuit for controlling the temperature of the electrical conductors before they exit from the thermally insulative housing of the plug-in module of FIG. 1.

Referring now to FIG. 5, a schematic diagram of the heater control circuit 70 is shown. The temperature sensor 66 could be any known device which provides a signal that varies inversely with temperature. Thus, as the temperature of the sensor 66 decreases, its resistance decreases and the amount of current through the sensor 66 increases. The sensor current divides between a resistor R1 and the base of a transistor Q1. The emitter of Q1 is connected to the emitter of a transistor Q2, and the collector of Q1 is connected to the base of Q2. This connection forms a Schmitt trigger configuration in which Q2 is conducting when the sensor 66 has a high resistance (i.e. when cold) and is non-conducting when the sensor has a low resistance (i.e. when warm). The upper and lower trigger points of the Schmitt trigger circuit are essentially merged to the same point by the direct connection of the collector of Q1 to the base of Q2. The merged trigger point can be adjusted up or down, as required, by changing resistors R1, R2, R3, and R4 in a known way. Transistors Q3 and Q4 are connected as a current driver with the collector of Q2 as the current driver input and Q4 as the current driver output.

The heater 59 is connected between the +V terminal of the circuit 70 and the collector lead of the current driver transistor Q4. The emitter lead of the current driver transistor Q4 is connected to −V of the circuit 70. In this common-emitter configuration, the current flowing through the heater 59 is a function of the current flowing into the base of Q4 through resistor R6.

In operation, as the temperature of the thermal sensor 66 increases from a cold state its resistance decreases and when the trigger point is reached, the current through the heater 59 is switched off, thereby reducing the amount of heat produced to warm the leads 50, 51. Similarly, as the temperature of the thermal sensor 66 decreases from a warm state its resistance increases until the trigger point is reached, at which time the current through the heater 59 is switched on to increase the amount of heat to the leads 50 and 51. By this operation, the heater 59 will warm the leads 50, 51 so they will not collect frost or moisture after the leads 50, 51 emerge from the electrically insulating, thermal conducting material 54 (see FIG. 4). Furthermore, the heater 59 will be controlled from producing too much heat and thereby slowing down or damaging the semiconductor circuit 38 (see FIG. 1).

An display indicator DS1, such as a light emitting diode, may be connected in parallel with the heater 59 to indicate when the heater 59 is drawing current.

Figure 6:
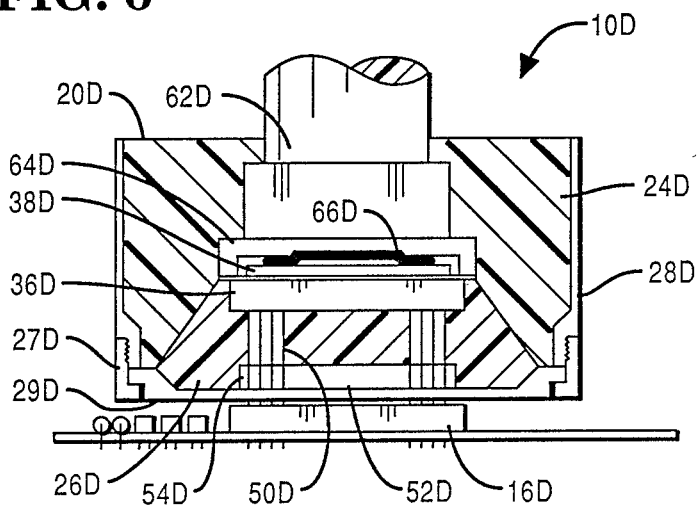
FIG. 6 is a cross sectional view of a second embodiment of the invention with a second type of insulative housing having a refrigerated cold plate as a circuit cooler.

Referring now to FIG. 6, there is shown an alternative embodiment of the invention. In this embodiment, a plug-in module 10D has an insulative housing 20D which has an upper insulator portion 24D and a lower insulator portion 26D. Both the upper insulator portion 24D and the lower insulator portion 26D are made from a low thermal conductance material such as a polystyrene plastic foam. Each insulator portion 24D, 26D is surrounded on its outside surface by a respective shell 28D, 29D, which is made from a durable plastic such as Teflon. The lower portion of the upper shell 28D may be threaded to receive a lock-ring 27D to tightly seal the upper shell 28D and the upper insulator portion 24D with the lower shell 29D and the lower insulator 26D.

An integrated circuit connector 36D is mounted upon the lower insulator portion 26D. A number of conductors 50D are connected at the connector 36D and pass through the lower insulative portion 26D into a channel 52D. The channel is partially filled with an electrically insulating, thermally conducting material 54D in substantially the same manner as the previous embodiment shown in FIGS. 1 and 2. The conductors 50D exit through in the lower shell 26D and plug-in to an external connector 16D.

An integrated circuit 38D is mounted with its leads (not shown) inserted into the connector 36D. Entering from the top of upper insulator portion 24D is a refrigerative cooling device 62D, which may be a phase change cooling device, a cryogenic fluid cooling device, or a Peltier effect cooling device. The refrigerative cooling device 62D has a cold plate 64D which is shaped to receive the upper surface of the integrated circuit 38D. To ensure an efficient exchange of heat between the integrated circuit 38D and the cold plate 64D, a conformal liner 66D lines the interface therebetween. The conformal liner 66D is made from a pliant material with good thermal conductance characteristics such as indium. The liner 66D fills any voids between the cold plate 64D and the integrated circuit 38D to maximize heat transfer.

The operation of the embodiment shown in FIG. 6 is the same as the previously described embodiments except that this embodiment of the plug-in module is designed to use cooling which is provided by the cold plate 64D instead of the refrigerant 30 shown in FIG. 1.

Thus, it will now be understood that there has been disclosed a new refrigerated plug-in module which provides for the refrigerative cooling of a semiconductor circuit which is connected to an external connector by a combination of passive and active temperature controlling components along with special electrical conductors.

As will be evident from the foregoing description, certain aspects of the invention are not limited to the particular details of the example illustrated, and it is therefore contemplated that other modifications or applications will occur to those skilled in the art. It is accordingly intended that the claims shall cover all such modifications and applications which do not depart from the true spirit and scope of the invention.

What is claimed as new and desired to be secured by Letters Patent of the United States is:

1. A low thermal conductance electrical connection apparatus for use between a lead of a semiconductor device and a receptacle of a connector mounted upon a printed circuit board, comprising:
 a first member having a receptacle on a first end for receiving said lead of said semiconductor device and a second end opposite said first end;
 an electrical conductor member, including:
 a thin-walled stainless steel tube member having a low thermal conductance; and
 a coating, that is thin relative to the thickness of the wall of said stainless steel tube member, of a metal having a high electrical conductance;
 said electrical conductor member having a first end connected to said second end of said first member; and
 a second end of said electrical conductor member connected to the receptacle of the printed circuit board connector;
 whereby said electrical conductor member has a good electrical conductance and a low thermal conductance.

2. A low thermal conductance electrical connection apparatus as set forth in claim 1, wherein said second end of said first member is overlapped and welded to said first end of said electrical conductor member.

3. A low thermal conductance electrical connection apparatus as set forth in claim 1, wherein said second end of said first member is overlapped and crimped to said first end of said electrical conductor member.

4. A low thermal conductance electrical connection apparatus as set forth in claim 1, wherein said second end of said first member has a second receptacle thereon for receiving said first end of said electrical conductor member.

5. A low thermal conductance electrical connection apparatus as set forth in claim 2, wherein the metal coating is plated gold.

6. A low thermal conductance electrical connection apparatus as set forth in claim 3, wherein the metal coating is plated gold.

7. A low thermal conductance electrical connection apparatus as set forth in claim 4, wherein the metal coating is plated gold.

* * * * *